United States Patent [19]

Vaughan

[11] 4,086,491
[45] Apr. 25, 1978

[54] DIRECT MEASUREMENT OF THE ELECTRON BEAM OF A SCANNING ELECTRON MICROSCOPE

[75] Inventor: William H. Vaughan, College Park, Md.

[73] Assignee: The United States of America as represented by the Secretary of the Navy, Washington, D.C.

[21] Appl. No.: 771,715

[22] Filed: Feb. 4, 1977

[51] Int. Cl.² .................................... G01N 27/00
[52] U.S. Cl. ............................. 250/397; 250/311
[58] Field of Search .................... 250/397, 311; 324/71 EB

[56] References Cited

U.S. PATENT DOCUMENTS

| 3,638,111 | 1/1972 | Ennis et al. | 324/71 EB |
| 3,736,422 | 5/1973 | Weber et al. | 250/311 |
| 3,784,909 | 1/1974 | Schutt et al. | 250/397 |

Primary Examiner—Bruce C. Anderson
Attorney, Agent, or Firm—R. S. Sciascia; Philip Schneider; David G. Rasmussen

[57] ABSTRACT

Apparatus for measuring the electron beam diameter of a scanning electron microscope includes: a transducer which supports a heated wire acting as a knife edge; an electron collector; and a display. The electron beam is scanned across the knife edge to obtain a change in current density which is received by the electron collector and shown as a trace on the display. This trace is a relative measurement of electron beam diameter. The electron beam is scanned a second time with the transducer moving the heated wire abruptly during the second scan to cause a shift in the current density trace on the display. The amount of shift between the traces of the initial and second scans is a reference distance against which the relative measurement of electron beam diameter may be measured.

17 Claims, 6 Drawing Figures

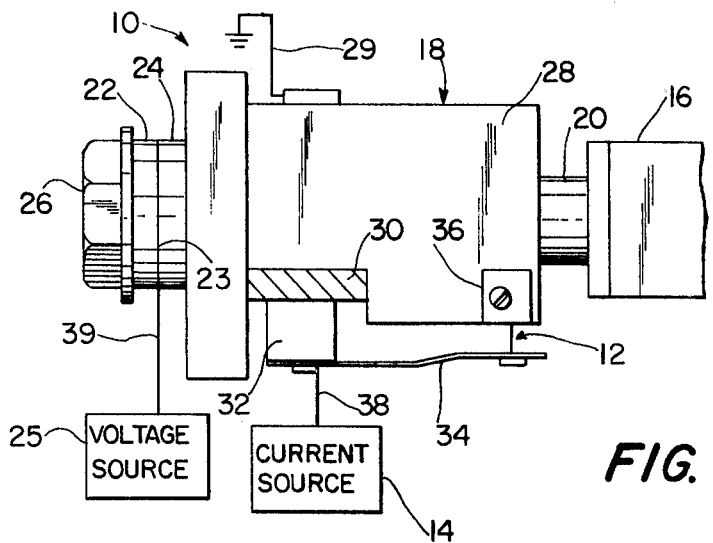
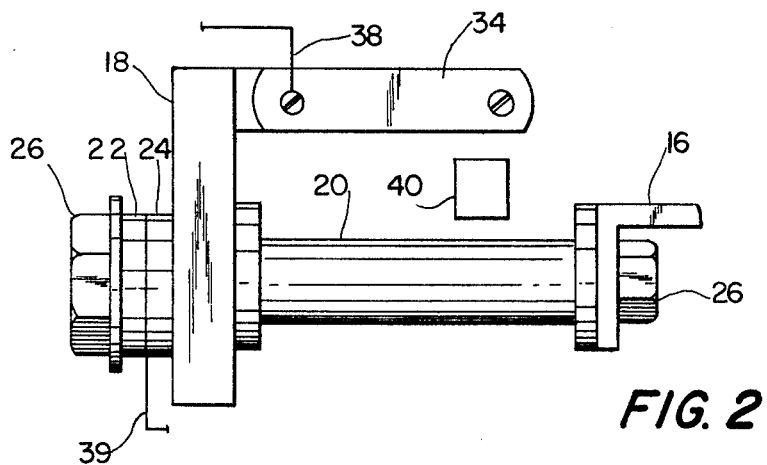
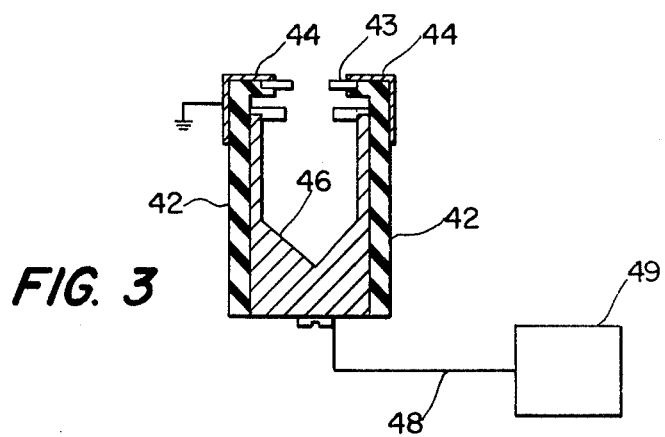

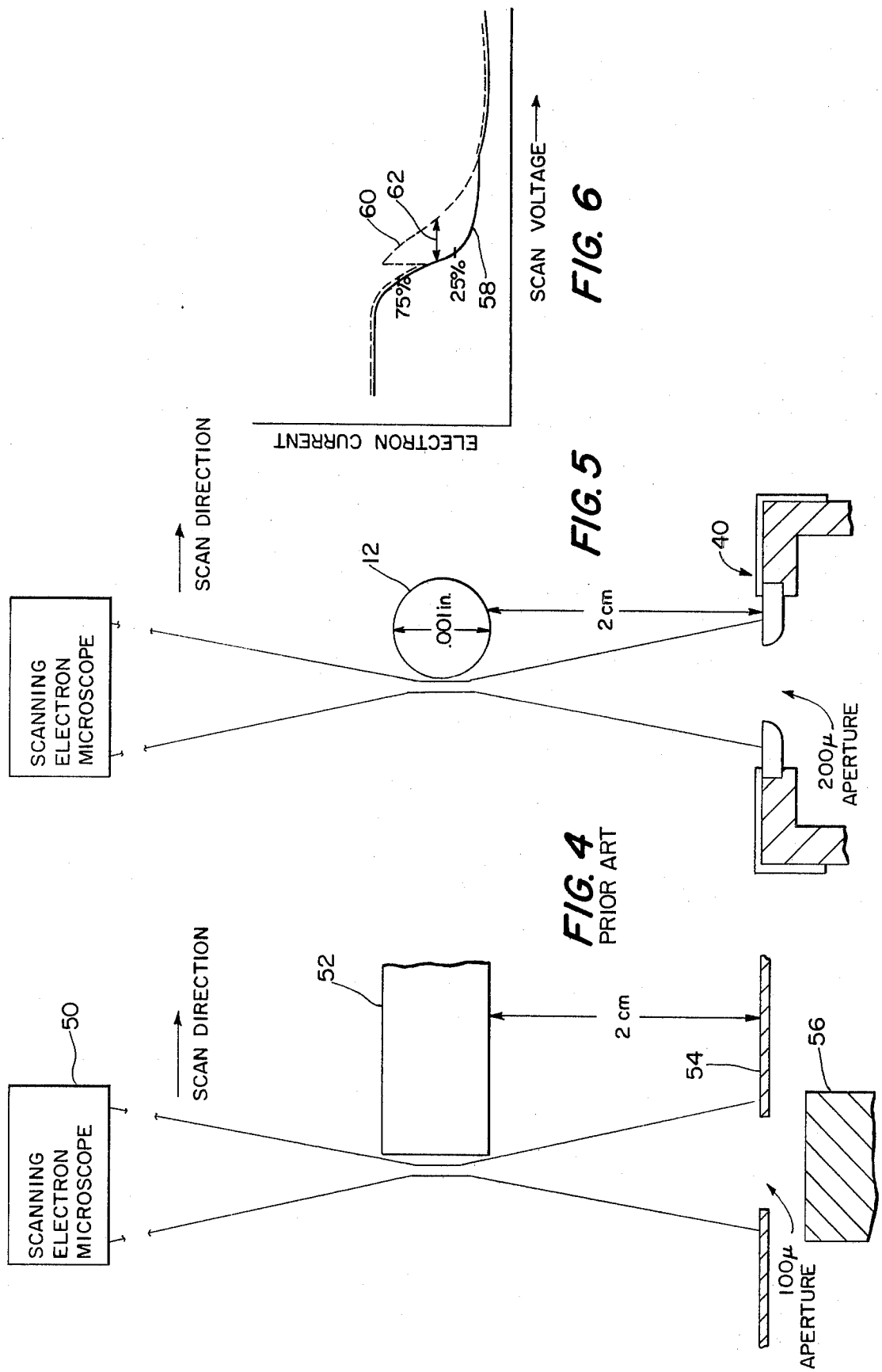

DIRECT MEASUREMENT OF THE ELECTRON BEAM OF A SCANNING ELECTRON MICROSCOPE

BACKGROUND OF THE INVENTION

1. Field of the Invention

The invention relates to apparatus for measuring the diameter of the electron beam of a scanning electron microscope (SEM). More particularly, the invention relates to the use of a heated wire acting as a knife edge for measuring the electron beam diameter and a transducer assembly for providing a known reference distance against which the measured electron beam diameter is compared.

2. Description of the Prior Art

The method currently used to measure the resolution of an SEM is to make a micrograph at high magnification of an object which contains a wealth of high contrast and fine detail. A measurement is then made of the shortest distance which is resolved on the micrograph and converted via the known magnification into a distance resolved on the specimen. Since the smallest resolvable distance is approximately equal to the beam diameter, measurements of the resolution have been used to determine beam diameters. The difficulty with this approach comes from the fact that the result depends upon the interaction between the specimen and the electron beam. The technique is also very slow. There is no way it could be used to determine the optimum settings for a combination of the variables that determine the beam diameter.

Another method has been proposed in an article "SEM Parameters and Their Measurement," D. C. Joy, SCANNING ELECTRON MICROSCOPE, 1974 (Part I) Proceedings of the Seventh Annual Scanning Electron Microscope Symposium, ITT Research Institute. The method uses a thick, rectangularly-shaped knife edge positioned at the narrowest part (i.e., focal point) of the electron beam. An aperture and electron detector below the knife edge are used to collect the current from the electron beam. The electron beam is scanned across the knife edge and the current density received by the electron detector is plotted on an $x$-$y$ graph to give an indication of electron-beam diameter.

SUMMARY OF THE INVENTION

The present inventor recognized several heretofore unknown problems with the prior art measurement system described by D. C. Joy and provides a solution to those problems. One major problem involves the buildup of carbonaceous material on the knife edge. This causes inaccuracies for two reasons: first, the carbonaceous material has a low density and results in a knife edge which is highly transparent to electrons when it is uncharged; and second, as the contamination layer acquires a charge, it deflects the electron beam by increasingly larger amounts. Another problem involves the use of a fracture edge of a silicon wafer as the knife edge. Since silicon is of low density, a thin piece will allow electrons to pass through and a thick section must be used in order to have a relatively opaque knife edge. Since the electron beam has a finite divergence at its focal point, the top and bottom edges of the thick, straight, vertical knife edge will strike portions of the electron beam above and below the focal point which are wider than the focal point. This will result in an apparently larger diameter than one would measure with a mathematically ideal knife edge which would be of zero thickness and mathematically opaque to electrons. A third problem involves the limited accuracy with which the beam diameter could be measured even if a non-contaminating, thin opaque knife edge were available. The accuracy of such a determination is limited to the accuracy with which the magnification of the microscope is known, 25% at best.

To solve the above-stated problems, the present invention utilizes a heated wire which acts as a knife edge. A current source provides a current through the wire to heat it. The SEM scans the electron beam across the heated wire and an electron collector receives the changing current of the electron beam which will provide a relative measurement of electron-beam diameter on, for example, an $x$-$y$ trace. This measurement must be compared with a known reference distance to determine what the measurement is in units of distance. To accomplish this, the SEM scans the electron beam across the knife edge a second time. During the scan, a transducer assembly causes the heated wire to move abruptly a known distance. Movement of the heated wire will cause the $x$-$y$ trace of the electron beam current to be shifted. The magnitude of the shift is related to the known distance the heated wire moves and is therefor a known reference distance against which the relative measurement of electron beam diameter from the first scan may be measured.

A novel feature of the invention is the use of heat to prevent the buildup of carbonaceous materials on the knife edge.

A second novel feature of the invention is the use of a cylindrical knife edge (i.e., wire) which causes measurement of the electron-beam diameter to be made at the narrowest possible point of the beam.

A third novel feature of the invention is the use of a high-density conductor, preferably tungsten, as the knife edge. This minimizes the number of electrons which travel through the knife edge after striking it and subsequently are received by the electron detector.

A fourth novel feature is the use of a transducer assembly to produce a known reference distance.

BRIEF DESCRIPTION OF THE DRAWINGS

FIG. 1 is a plan view of apparatus for measuring the electron beam of a scanning electron microscope.

FIG. 2 is an elevation view of the apparatus of FIG. 1.

FIG. 3 is an expanded sectional view of the electron collector used in the apparatus of FIG. 2.

FIG. 4 is a diagrammatic view of the prior art method of measuring the diameter of the electron beam of a scanning electron microscope.

FIG. 5 is a diagrammatic view of the method of the invention for measuring the diameter of the electron beam of a scanning electron microscope. FIG. 6 is a graph of electron beam current plotted against scan voltage of the scanning electron microscope of FIGS. 1, 2.

DETAILED DESCRIPTION OF THE PREFERRED EMBODIMENT

Apparatus for measuring the diameter of an electron beam in a scanning electron microscope is outlined in FIG. 1. The apparatus is generally composed of: a transducer assembly 10, a heated wire 12 supported by the transducer assembly, a current source 14 providing current to the heated wire, and a frame member 16 which attaches the transducer assembly to the stage of the scanning electron microscope.

Transducer assembly 10 includes: a support 18, an elastic compliance member 20 (partially shown), a pair of transducer discs 22, 24 (or plates), a voltage source 25 and mechanical biasing element 26.

Support 18 contains a massive aluminum conducting member 28 for heat dissipation, ground lead 29, insulator 30, spacer 32, beryllium-copper strip 34, and anchor 36 having a locking screw for heated wire 12. Insulator 30 is integrally attached to aluminum conducting member 28 and supports spacer 32. Beryllium-copper strip 34 is attached to spacer 32 and acts as a conductor and a spring. Power lead 38 extends from current source 14 to beryllium-copper strip 34.

Heated wire 12 is stretched under tension between strip 34 and anchor 36. The stretched length of the heated wire 12 is about 1 mm. The tension on the wire and its short length make the wire stiff and prevent movement of it when an electron beam is scanned across it. Heated wire 12 is a high-density conductor such as tungsten and may have a diameter of 0.001 inches. With such a diameter, it passes 0.45 amps to have the proper current density for preventing contamination on the wire. Correspondingly higher current at the same current density could be passed through larger diameter wires.

Elastic compliance member 20 is an elastic material capable of being compressed and returning to its original shape after compression. In the preferred embodiment, it is machined out of a single piece of brass so that it is essentially a thin walled cylinder with heavy integral end faces.

Transducer discs 22, 24 are washer-shaped circular discs which may be made of a material designated by Military Standard 1376 revised form — Navy type III — very hard lead zirconate - titanate with a Curie point larger than or equal to 290° C. An example of this is "PZT-8" produced by the Clevite Corporation which is composed of lead zirconate — lead titanate ceramic transducer material with chemical additives including $Fe_2O_3$. They are placed in contact with each other and oriented so that their polarization vectors are oppositely directed. Different numbers of transducer discs could be used depending on their respective thicknesses. PZT-8 was chosen as the transducer material because of its reproducibility. Other materials having reproducible characteristics of the same order could also be used. Transducer discs 22, 24 are in contact with each other through a thin copper ring 23 placed therebetween. They are oriented so that their polarization vectors are oppositely directed. The outside surfaces are kept at ground potential while the driving voltage from voltage source 25 is applied through lead 39 to the copper ring 23 between the central common surfaces. The transducer discs are covered with a metal foil at ground potential to shield the interior of the microscope from the voltages that are applied to the transducer. Otherwise the trajectories of the electrons would be affected when a voltage is applied to the transducer.

Mechanical biasing element 26 is a stainless steel bolt which is much more than 10 times stiffer than elastic compliance member 20. It extends through transducer discs 22, 24 (and is electrically insulated therefrom), support 18, elastic compliance member 20, and frame member 16. The nut on the end of mechanical biasing element 26 is hidden by frame member 16. The function of mechanical biasing member 26 is to maintain a mechanical bias on transducer discs 22, 24. This mechanical bias is necessary to make the transducer displacement-voltage behavior reproducible and virtually hysteresis-free.

FIG. 2 is a side view of the apparatus of FIG. 1. Mechanical biasing member 26 extends through transducer discs 22, 24, support 18, elastic compliance member 20, and frame member 16. Attached to support 18 is beryllium-copper strip 34 which has power lead 38 attached. An electron collector 40 is shown to be directly beneath beryllium-copper strip 34 and heated wire 12 (not visible). Power source lead 39 is attached to the copper ring between the inner surfaces of transducer discs 22, 24.

FIG. 3 is a vertical sectional view of electron collector 40 which in the preferred embodiment is a Faraday cell. An insulator 42 is the outer surface of the electron collector 40. In the top of insulator 42 is a tungsten ring 43 which has a 200-micron aperture. On top of tungsten ring 43 is a grounded copper shield 44, and enclosing the bottom of the Faraday cell is an electronic charge-collecting copper element 46. Connected to copper element 46 is shielded lead 48 which transfers the electron charges collected to a display 49 made up of an electrometer and x-y recorder.

FIG. 4 shows diagrammatically the measurement of the diameter of an electron beam of an electron scanning microscope utilizing the apparatus of the prior art. Scanning electron microscope 50 produces an electron beam which scans in the direction indicated. A portion of the electron beam is shown as excluded and the narrowest portion of the beam, which is the focusing point at which a specimen would normally be placed, is blown up. A knife edge 52, which may be a copper mesh (10-micron repeat, of the type used in vidicon tubes) or the fractured edge of a silicon slice, is shown at the point of focus of the beam. A charge collector is made up of a shield 54, with a 100-micron aperture therein, and an electron detector 56.

In the prior art the focused probe is scanned normal to the knife edge 52 (in the direction indicated) and the electron charges are collected by the detector 56. The intensity of the collected charge is graphically plotted to provide an indication of electron beam diameter.

Several major problems occur with the knife edge of the prior art which decrease accuracy of the electron beam measurement. Briefly, these problems involve the buildup of carbonaceous materials on the knife edge, the use of a thick rectangular knife edge, the use of a low-density conductor (silicon or copper) for the knife edge, and the lack of an accurate knowledge of the distances involved. These problems will be considered in detail subsequently.

FIG. 5 shows diagrammatically the measurement of the diameter of the electron beam of the present invention. Scanning electron microscope 50 generates the same scanning beam shown in FIG. 4. Heated wire 12 having a diameter of 0.001 in. is used as the knife edge at the focal point of the beam. Electron collector 40 shown in detail in FIG. 3 is used to collect the electron charges and transfer them to an electrometer and x-y recorder which will graphically plot the diameter of the electron beam.

FIG. 6 shows an x-y plot with the y direction representing the electron collector current and the x direction representing the scan voltage. Trace 58 on the graph represents electron beam current collected as the electron beam is scanned past the knife edge. Trace 60, a broken line, represents electron beam current collected as the electron beam is scanned partially over the knife edge and the transducer is activated which shifts the heated wire a known distance, causing the trace to be shifted. The amount by which the trace is shifted is related to the known magnitude of the knife edge movement. The distance of the trace shift, shown by arrow 62, is used as a known reference distance from which the diameter of the beam may be calculated. The beam diameter is measured by determining the 25 and 75% points (25 and 75% of the maximum beam current) on the x-y plot of the current received by the Faraday cell. Use of these two points makes it possible to avoid the error caused by using the flat portions of the current curve (horizontal portion of the trace in FIG. 6). Scattered electrons from the knife edge have a much larger effect on the horizontal portion of the curve than on the steeper portion. A theoretical analysis of the effect is given in "The Direct Measurement of SEM Beam Diameters," William H. Vaughan, Scanning Electron Microscopy/1976, Part I, Proc. 9th Annual SEM Symposium of IITRI (Illinois Institute of Technology Research Institute), Chicago, Ill., 60616, Apr. 1976 pps 745-755, which is hereby incorporated by reference.

In operation, two steps are generally required to obtain a measurement of the electron beam diameter. The first is to obtain a measurement of the electron beam diameter which is relative and has no units of distance. The second step is to establish a reference distance against which the relative electron beam measurement may be compared and then the distance can be determined in distance units.

To obtain a relative measurement of electron beam diameter, the scanning electron microscope 54 is adjusted such that the narrowest point of its beam (i.e., focal point) is focused on the edge of heated wire 12. Scanning electron microscope 54 then scans the electron beam along a line perpendicular to heated wire 12 which is stationary and above electron collector 40. As the electron beam scans across the knife edge, the resulting variation in the current of the electron beam is received by electron collector 40 and sent to the electrometer whose output drives an x-y recorder. The x motion of the recorder is driven by the same signal that drives the electron beam across the sample. The output of the electrometer is fed to the y input of the recorder. The resulting plot on the x-y recorder is that shown in FIG. 6.

The second step in the measurement of the electron beam diameter, establishment of a reference distance, is accomplished as follows. Scanning electron microscope 54 causes the electron beam to scan across the knife edge again. While the scan is taking place, a D.C. voltage is set up across the transducer causing the knife edge to be shifted a known distance. This causes a shift in the beam current plot on the x-y recorder, as shown by trace 60 on FIG. 6. The distance between the initial and shifted scans of the electron beam, shown by arrow 62 of FIG. 6, is measured on the x-y plot (i.e., the difference in scan voltage is determined for the same beam current on the two curves). It corresponds to a distance in the specimen in the microscope equal to the calibrated displacement of the transducer for the applied voltage. In this way displacement along the x axis of the x-y plot is calibrated with an accuracy that is determined by a National Bureau of Standards calibration.

Looking more closely at how the transducer moves the heated wire, a voltage from a D.C. voltage source 25 is applied through lead 39 to the central common surface of transducer discs 22, 24. This increases the thickness of the transducer discs. The mechanical biasing member 26 provides a mechanical bias to transducer discs and to elastic compliance member 20. An increase in thickness of the transducer discs causes the elastic compliance member to compress. Support 18 which is positioned between transducer discs 22, 24 and elastic compliance member 20 will be displaced by the amount that the elastic compliance member 20 compresses. Since heated wire 12 is supported on support 18 the heated wire will move through the electron beam the same distance as the support. As the heated wire moves through the beam, the electron collector 40 will sense the change in current in the electron beam and an x-y trace such as that shown as trace 60 of FIG. 6 will result.

It should be noted that although optimum accuracy of measurement is achieved by comparing the relative measurement of the electron beam diameter with the reference established by the use of the transducer, the relative measurement of electron beam diameter could also be compared with a reference established by using the known magnification of the scanning electron microscope as previously discussed with respect to prior art. The accuracy of this method is not optimum however. If this method were used the transducer would not be needed and only a support for the heated wire would be needed. An example of such a support could be support 18, shown in FIG. 1, attached to an appropriate frame.

One improvement of the invention is the use of a heated wire on the knife edge. Heating the knife edge is necessary to get valid results because a single passage of the electron beam across the knife edge can cause a detectable amount of contamination buildup. The contamination buildup is caused by the hydrocarbons that are present in all similar vacuum systems due to the diffusion pump fluid and the elastromers that are used as seals. This forms a surface film on everything within the microscope. When this film of hydrocarbons is struck by an energetic electron beam, the high volatility products go off as gases leaving a low-conductivity carbonaceous layer behind. The low conductivity of this layer causes it to acquire a charge when exposed to the full electron beam. The resulting electrostatic deflection of the beam causes the edge trace to become diffused and makes an accurate measurement of the beam diameter impossible. Heating the wire causes hydrocarbon molecules striking the wire to statistically spend less time on the surface of the wire and thus a significant buildup of a carbonaceous material does not form. In experiments conducted using a wire which was not heated, the current density traces such as that shown in FIG. 6 leveled out after several scans until the trace became irregular and almost linear. When a heated wire was used, accurate, reproducible, current density traces were consistently achieved. As mentioned previously, 0.45 amps passed through a 0.001 in. wire was sufficient to prevent all detected effects due to contamination. Correspondingly higher currents at the same current density are sufficient for larger diameter wires.

Another important aspect of this invention is the use of a high-density cylindrical (i.e., tungsten wire) knife edge rather than the thick rectangular knife edge disclosed in the prior art. The cylindrical knife edge is desired since the electron beam has a finite divergence angle. The electron beam is best cut off using a cylindrical knife edge since it begins measurement of the electron beam at the narrowest portion of the electron beam. This is clearly shown by comparison of the knife edge shown in FIGS. 4 and 5. A 0.001 in. diameter tungsten wire for a knife edge is considered near optimum for 20 KV electrons at a semi-convergence angle of 0.01 radians for several reasons. If the diameter is less than 0.001 in., more electrons will pass through the wire and enter the electron collector. If the diameter is substantially greater than 0.001 inches, the wire does not cause the beam to be measured in its narrowest portion. This is the same problem as with the prior art knife edge. Furthermore, it is desirable to use tungsten since it is a high-density conductor through which electrons will not easily pass, and it is also strong which is necessary for a thin wire of 0.001 in, diameter.

Another important aspect of this invention is the use of two points on the steep portion of the current trace from which to make measurements which characterize the beam diameter. In this way the effect due to electrons that have been scattered from the top of the knife edge and subsequently picked up by the Faraday cell is minimized.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. Apparatus for obtaining a relative measurement of the electron beam diameter of a scanning electron microscope comprising:
    current source means for generating electrical current;
    heated wire means connected to said current source means, for acting as a knife edge to cause a change in the current density of said electron beam as it is scanned across said knife edge;
    support means for supporting said heated wire means;
    electron collector means for receiving said electron beam after it has passed said knife edge; and
    display means receiving the output of said electron collector for utilizing said received changing current density of said electron beam to display a relative measurement of said electron beam diameter.

2. The apparatus of claim 1 in which said heated wire means is a tungsten wire.

3. The apparatus of claim 2 in which said tungsten wire is approximately 0.001 inches in diameter.

4. The apparatus of claim 2 in which said tungsten wire is approximately 1 millimeter long.

5. The apparatus of claim 2 in which said electron collector is a Faraday cell.

6. Apparatus for measuring the electron beam of a scanning electron microscope, comprising;
    current source means for generating electrical current;
    heated wire means connected to said current source means for acting as a knife edge to cause a change in current density of said electron beam as it is scanned across said knife edge during an initial scan;
    transducer assembly means supporting said heated wire means for moving said heated wire a known distance during a second scan of said electron beam to cause a shifted change in current density of said electron beam as it is scanned across said knife edge;
    electron collector means for receiving said electron beam of said initial and said second scans; and
    display means receiving said electron collector output for said initial and second scans to display a relative measurement of said electron beam diameter and a shifted measurement of said electron beam diameter with the amount of said shift providing a reference distance against which said relative measurement of said electron beam diameter may be compared.

7. The apparatus of claim 6 in which said heated wire means, is a tungsten wire.

8. The apparatus of claim 7 in which said tungsten wire is aproximately 0.001 inches in diameter.

9. The apparatus of claim 7 in which said tungsten wire is approximately 1 millimeter long.

10. The apparatus of claim 7 in which said electron collector is a Faraday cell.

11. The apparatus of claim 6 in which said transducer assembly comprises:
    D.C. voltage source means for generating a D.C. voltage;
    one or more transducer plate means receiving said D.C. voltage for changing in thickness in response to application of said D.C. voltage;
    elastic compliance means proximate to and cooperating with said transducer plate means for changing in thickness in response to a change in thickness by said transducer plate means;
    mechanical bias means proximate to said elastic compliance means and said transducer plate means for providing a bias to said elastic compliance means and said transducer plate means;
    support means proximate to said elastic compliance means for supporting said heated wire with tension, said support means cooperating with said elastic compliance means to move in response to movement of said elastic compliance means; and
    frame members means connected to said mechanical bias means for supporting said mechanical bias means.

12. The apparatus of claim 11 in which said transducer plate means are fabricated from a transducer material of high reproducibility.

13. The apparatus of claim 12 in which said transducer plate means are fabricated from a transducer material composed of very hard lead zirconate-titanate with a curie point larger than or equal to 290° C.

14. The apparatus of claim 11 in which said support means is positioned between said transducer plate means and said elastic compliance means.

15. The apparatus of claim 14 in which said mechanical bias means extends through said transducer plates means, said support means, said elastic compliance means, and said frame member means, said frame member means being adjacent to said elastic compliance means, and said mechanical bias means being adjacent to said frame member means and said transducer plate means and providing a mechanical bias thereto.

16. A method for obtaining a relative measurement of the electron beam diameter of a scanning electron microscope comprising the steps of:
    providing an electrical current through a wire to heat the wire;
    scanning said electron beam across said heated wire to generate a changing current;

receiving the changing current of the electron beam with an electron collector to provide a relative measurement of the electron beam diameter;

displaying said relative measurement of said electron beam diameter.

17. The method of claim 16 including the steps of:

moving said heated wire a known distance by a transducer assembly during a second scan of said electron beam to generate a pair of similar current densities, one shifted from the other, as said electron beam is scanned across said knife edge;

displaying said second scan, with the amount of said current density shift being a reference distance against which said relative measurement of said electron beam diameter may be compared.

* * * * *